(12) United States Patent
Ohno

(10) Patent No.: US 12,198,947 B2
(45) Date of Patent: Jan. 14, 2025

(54) SUBSTRATE CLEANING METHOD AND SUBSTRATE CLEANING DEVICE

(71) Applicant: Tokyo Electron Limited, Tokyo (JP)

(72) Inventor: Hiroki Ohno, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 136 days.

(21) Appl. No.: 17/771,144

(22) PCT Filed: Oct. 12, 2020

(86) PCT No.: PCT/JP2020/038507
§ 371 (c)(1),
(2) Date: Apr. 22, 2022

(87) PCT Pub. No.: WO2021/079779
PCT Pub. Date: Apr. 29, 2021

(65) Prior Publication Data
US 2022/0367214 A1    Nov. 17, 2022

(30) Foreign Application Priority Data

Oct. 23, 2019   (JP) ................................ 2019-193049

(51) Int. Cl.
*H01L 21/67* (2006.01)
*C23C 16/455* (2006.01)

(52) U.S. Cl.
CPC .. *H01L 21/67051* (2013.01); *C23C 16/45563* (2013.01); *H01L 21/67103* (2013.01)

(58) Field of Classification Search
CPC ......... H01L 21/67051; H01L 21/67103; C23C 16/45563
See application file for complete search history.

(56) References Cited

U.S. PATENT DOCUMENTS

| | | | |
|---|---|---|---|
| 2002/0115803 A1* | 8/2002 | Peterson | C08F 10/02 526/943 |
| 2007/0130716 A1* | 6/2007 | Yamada | H01L 21/67051 15/300.1 |
| 2010/0108104 A1* | 5/2010 | Hsieh | G03F 1/82 134/182 |
| 2010/0193472 A1* | 8/2010 | Tabat | H01J 37/317 427/523 |
| 2015/0007858 A1* | 1/2015 | Matsuo | H01L 21/02046 156/345.24 |

(Continued)

FOREIGN PATENT DOCUMENTS

| | | |
|---|---|---|
| JP | 2013-46001 A | 3/2013 |
| WO | WO88/06637 A1 * | 9/1988 |

*Primary Examiner* — Sharidan Carrillo
(74) *Attorney, Agent, or Firm* — Nath, Goldberg & Meyer; Jerald L. Meyer; Tanya E. Harkins

(57) ABSTRACT

A substrate cleaning method includes: supplying a gas mixture of a cluster forming gas for forming a cluster by adiabatic expansion and a carrier gas having a smaller molecular weight or atomic weight than the cluster forming gas to a nozzle; forming the cluster by injecting the gas mixture from the nozzle; removing particles adhering to the substrate by the cluster; and continuously supplying the carrier gas to the nozzle for a set time period from an end time of the supply of the cluster forming gas to the nozzle.

10 Claims, 7 Drawing Sheets

(56) References Cited

U.S. PATENT DOCUMENTS

| | | | |
|---|---|---|---|
| 2015/0027501 A1* | 1/2015 | Dobashi | H01L 21/67028 15/303 |
| 2015/0052702 A1* | 2/2015 | Dobashi | H01L 21/67028 15/303 |
| 2016/0096210 A1* | 4/2016 | Butterbaugh | H01L 21/02043 134/21 |
| 2016/0303617 A1* | 10/2016 | Mbanaso | H01L 21/02043 |
| 2019/0035651 A1* | 1/2019 | Dobashi | H01L 21/67248 |

* cited by examiner

SUBSTRATE CLEANING METHOD AND SUBSTRATE CLEANING DEVICE

This is a National Phase Application filed under 35 U.S.C. 371 as a national stage of PCT/JP2020/038507, filed Oct. 12, 2020, an application claiming the benefit of Japanese Application No. 2019-193049, filed Oct. 23, 2019, the content of each of which is hereby incorporated by reference in its entirety.

TECHNICAL FIELD

The present disclosure relates to a substrate cleaning method and a substrate cleaning device.

BACKGROUND

A substrate cleaning method described in Patent Document 1 includes a step of forming a cluster of chlorine trifluoride by injecting a gas mixture of a chlorine trifluoride gas and an argon gas from a nozzle, and a step of colliding the formed cluster with a surface of a single crystalline silicon.

PRIOR ART DOCUMENTS

Patent Document

Japanese Laid-Open Publication No. 2013-46001

SUMMARY

One aspect of the present disclosure provides a technique capable of suppressing occurrence of defects in a substrate when injection of a gas mixture of a cluster forming gas and a carrier gas toward the substrate ends.

According to one aspect of the present disclosure, a substrate cleaning method includes:

supplying a gas mixture of a cluster forming gas for forming a cluster by adiabatic expansion and a carrier gas having a smaller molecular weight or atomic weight than the cluster forming gas to a nozzle;

forming the cluster by injecting the gas mixture from the nozzle;

removing particles adhering to the substrate by the cluster; and continuously supplying the carrier gas to the nozzle for a set time period from an end time of the supply of the cluster forming gas to the nozzle.

According to one aspect of the present disclosure, it is possible to suppress occurrence of defects in a substrate when injection of a gas mixture of a cluster forming gas and a carrier gas toward the substrate ends.

DETAILED DESCRIPTION

Figure 1:
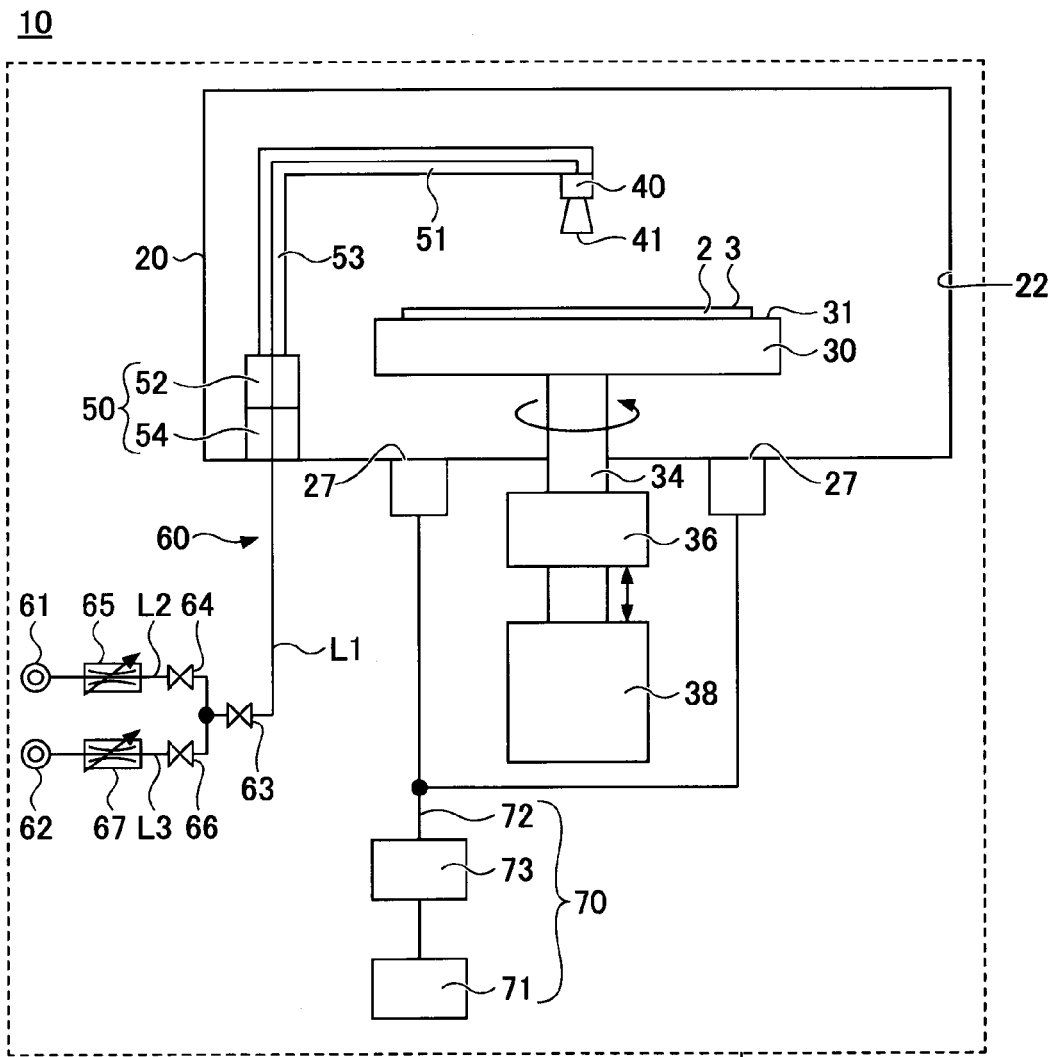
FIG. 1 is a side view showing a substrate cleaning device according to an embodiment.

Embodiments of the present disclosure will now be described in detail with reference to the drawings. Throughout the drawings, the same or corresponding parts and portions are denoted by the same or corresponding reference numerals, and explanation thereof may be omitted. In the following description, an X-axis direction, a Y-axis direction, and a Z-axis direction are orthogonal to one another, wherein the X-axis direction and the Y-axis direction are a horizontal direction, and the Z-axis direction is a vertical direction. Further, a lower direction means downward in the vertical direction (negative direction in the Z-axis), and an upper direction means upward in the vertical direction (positive direction in the Z-axis).

FIG. 1 is a side view showing a substrate cleaning device according to an embodiment. A substrate cleaning device 10 removes particles 5 (see FIG. 3) adhering to a main surface 3 of a substrate 2 by injecting a gas toward the main surface 3 of the substrate 2. The substrate 2 is a semiconductor substrate such as a silicon wafer. The substrate cleaning device 10 includes a process container 20, a substrate holder 30, a rotary shaft 34, a rotary drive 36, an elevation drive 38, a nozzle 40, a drive 50, a gas supply 60, a gas suction part 70, and a controller 90.

The process container 20 has therein a space in which the substrate 2 is processed. The inside of the process container 20 is, for example, a cylindrical space. The process container 20 has a gate (not shown) that is a port for loading and unloading the substrate 2, and a gate valve (not shown) that opens and closes the gate.

The substrate holder 30 is disposed inside the process container 20 and has a substrate holding surface 31 for holding the substrate 2. The substrate holder 30 holds the substrate 2 horizontally, for example, with the main surface 3 of the substrate 2 from which the particles 5 are to be removed facing upward.

The rotary shaft 34 extends downward from the center of the substrate holder 30 and is arranged vertically. An upper end portion of the rotary shaft 34 is disposed inside the process container 20, and a lower end portion of the rotary shaft 34 is disposed outside the process container 20.

The rotary drive 36 rotates the substrate holder 30 by rotating the rotary shaft 34 around a vertical axis. The rotary drive 36 has, for example, a rotary motor and a transmission mechanism for transmitting a rotation driving force of the rotary motor to the rotary shaft 34.

The elevation drive 38 moves the substrate holder 30 vertically. The elevation drive 38 is composed of, for example, a fluid pressure cylinder or the like. The elevation drive 38 moves the substrate holder 30 vertically via the rotary drive 36. Alternatively, the elevation drive 38 may move the substrate holder 30 vertically without using the rotary drive 36.

The nozzle 40 injects a gas toward the main surface 3 of the substrate 2 held by the substrate holder 30. The nozzle 40 is disposed above the substrate holder 30 with a gas injection port 41 facing downward.

For example, the nozzle 40 injects the gas in a direction (for example, in the vertical direction) perpendicular to the main surface 3 of the substrate 2 held by the substrate holder 30. Since the gas collides perpendicularly with the main surface 3 of the substrate 2, it is possible to suppress a pattern collapse of an uneven pattern, which has been formed on the main surface 3 of the substrate 2 in advance.

The drive 50 moves the nozzle 40 in a radial direction of the substrate holder 30. The drive 50 moves the nozzle 40 between a position directly above a central portion of the substrate holder 30 and a position directly above an outer peripheral portion of the substrate holder 30. In addition, the drive 50 moves the nozzle 40 to a position outside the substrate holder 30 in the radial direction. The position outside the substrate holder 30 in the radial direction is a standby position where the nozzle 40 stands by when no gas is injected.

Figure 2:
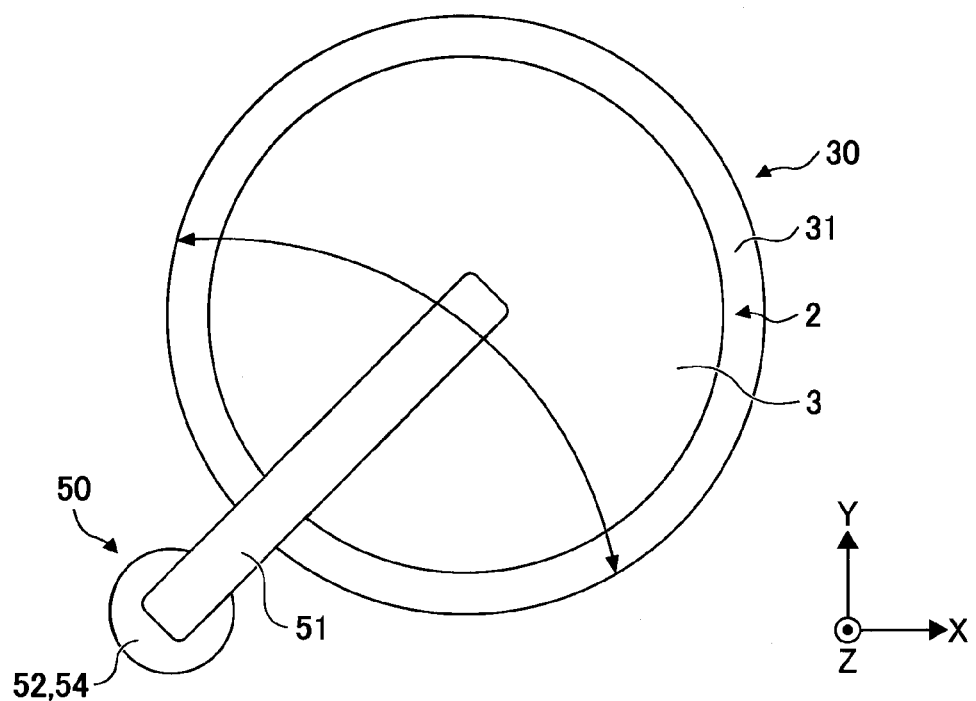
FIG. 2 is a plan view showing a nozzle moving mechanism according to an embodiment.

FIG. 2 is a plan view showing the drive according to an embodiment. As shown in FIG. 2, the drive 50 includes, for example, a swivel arm 51 and a swivel drive 52 that swivels the swivel arm 51. The swivel arm 51 is arranged horizontally, and the nozzle 40 is held at a leading end portion of the swivel arm 51 with the injection port 41 of the nozzle 40 facing downward. The swivel drive 52 swivels the swivel arm 51 around a swivel shaft 53 extending downward from a base end portion of the swivel arm 51.

In addition, the drive 50 may have a guide rail and a linear drive mechanism, instead of the swivel arm 51 and the swivel drive 52. The guide rail is arranged horizontally and the linear drive mechanism moves the nozzle 40 along the guide rail.

As shown in FIG. 1, the drive 50 may further include an elevation drive 54 that moves the nozzle 40 vertically. The elevation drive 54 is composed of, for example, a fluid pressure cylinder or the like. The elevation drive 54 moves the nozzle 40 vertically via the swivel drive 52. Alternatively, the elevation drive 54 may moves the nozzle 40 vertically without using the swivel drive 52.

The gas supply 60 supplies a cluster forming gas to the nozzle 40. The cluster forming gas is injected from the nozzle 40. Since the cluster forming gas adiabatically expands inside the process container 20 which has been depressurized in advance, the cluster forming gas is cooled to a condensation temperature and forms a cluster 4 which is an aggregate of molecules or atoms. The cluster forming gas includes at least one gas selected from the group consisting of, for example, carbon dioxide ($CO_2$) gas and argon (Ar) gas.

In addition, the gas supply 60 supplies a carrier gas to the nozzle 40. The carrier gas has a smaller molecular weight or atomic weight than the cluster forming gas. Therefore, the carrier gas has a higher condensation temperature than the cluster forming gas. Accordingly, the carrier gas does not form the cluster 4. The carrier gas includes at least one gas selected from the group consisting of, for example, hydrogen ($H_2$) gas and helium (He) gas.

The gas supply 60 supplies a gas mixture of the cluster forming gas and the carrier gas to the nozzle 40. In the present embodiment, $CO_2$ gas is used as the cluster forming gas, and $H_2$ gas is used as the carrier gas. The combination of the cluster forming gas and the carrier gas is not particularly limited.

The gas supply 60 includes a common line L1 having a downstream end connected to the nozzle 40, a first branch line L2 extending from an upstream end of the common line L1 to a first source 61, and a second branch line L3 extending from the upstream end of the common line L1 to a second source 62. The first source 61 is a source of the $CO_2$ gas. Further, the second source 62 is a source of the $H_2$ gas.

The common line L1 is provided with a pressure regulator 63 that regulates a gas supply pressure P to the nozzle 40. The pressure regulator 63 regulates the gas supply pressure P to the nozzle 40 under a control of the controller 90. The common line L1 may be further provided with a pressure booster such as a gas booster on an upstream side of the pressure regulator 63.

The first branch line L2 is provided with a first opening/closing valve 64 and a first flow rate regulating valve 65. When the controller 90 opens the first opening/closing valve 64, the $CO_2$ gas is supplied from the first source 61 to the nozzle 40. During that time, the controller 90 regulates the flow rate of the $CO_2$ gas by the first flow rate regulating valve 65. When the controller 90 closes the first opening/closing valve 64, the supply of the $CO_2$ gas from the first source 61 to the nozzle 40 is stopped.

The second branch line L3 is provided with a second opening/closing valve 66 and a second flow rate regulating valve 67. When the controller 90 opens the second opening/closing valve 66, the $H_2$ gas is supplied from the second source 62 to the nozzle 40. During that time, the controller 90 regulates the flow rate of the $H_2$ gas by the second flow rate regulating valve 67. When the controller 90 closes the second opening/closing valve 66, the supply of the $H_2$ gas from the second source 62 to the nozzle 40 is stopped.

The gas suction part 70 depressurizes the inside of the process container 20. The gas suction part 70 includes, for example, a suction pump 71 configured to suck a gas inside the process container 20, a suction line 72 extending from a suction port 27 formed on an inner wall surface 22 of the process container 20 to the suction pump 71, and a pressure regulator 73 provided in the middle of the suction line 72. The pressure regulator 73 regulates a pressure inside the process container 20 under a control of the controller 90.

Figure 3:
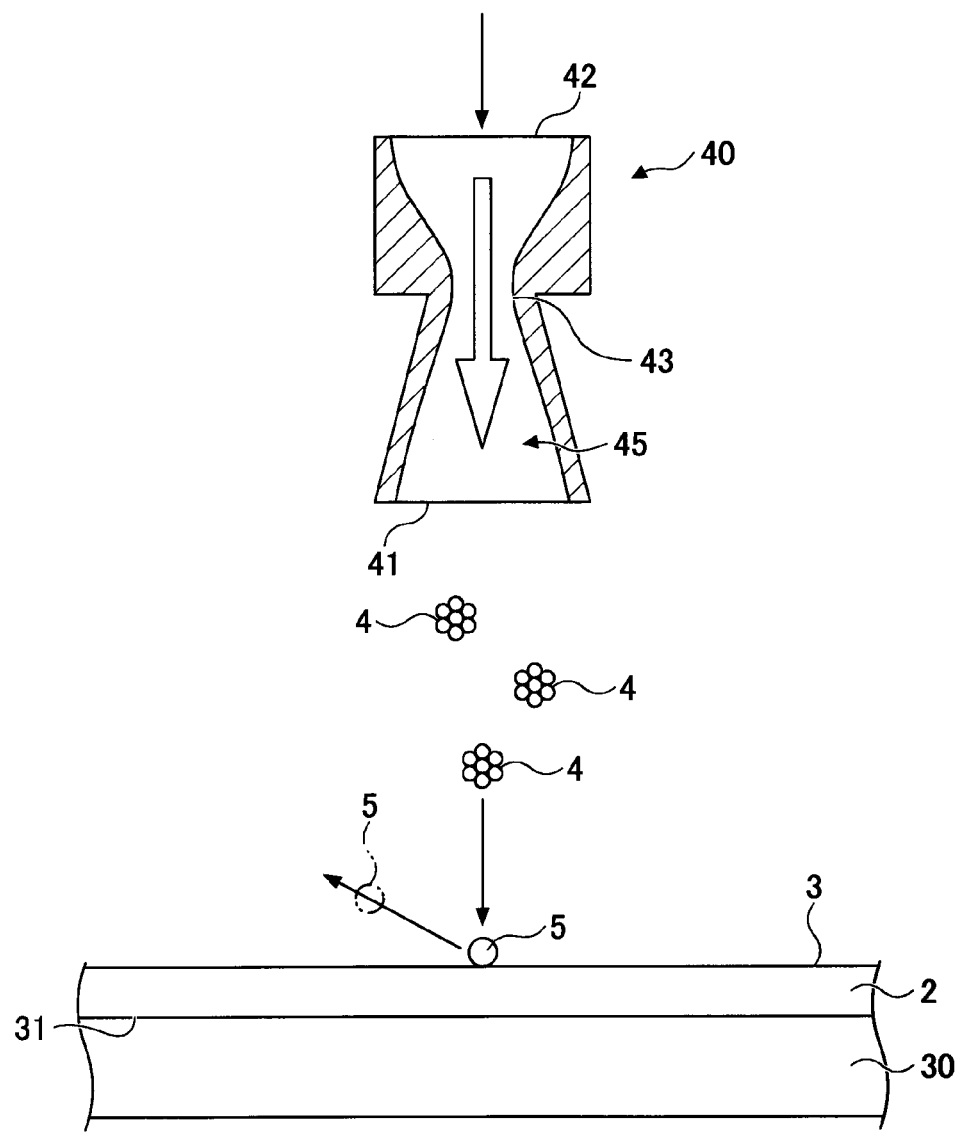
FIG. 3 is a cross-sectional view showing formation of a cluster according to an embodiment.
Figure 3:
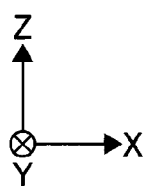

FIG. 3 is a cross-sectional view showing formation of a cluster according to an embodiment. The nozzle 40 is, for example, one that is generally referred to as a Laval nozzle, and has a throat 43 having a smaller diameter than both of the injection port 41 and a supply port 42. The nozzle 40 has a tapered hole 45, which is formed between the throat 43 and the injection port 41 and has a diameter that increases from the throat 43 toward the injection port 41.

The nozzle 40 is disposed inside the process container 20. The inside of the process container 20 is depressurized in advance by the gas suction part 70. The gas supplied to the supply port 42 of the nozzle 40 is accelerated while passing through the throat 43 and is injected from the injection port 41. Since the injected $CO_2$ gas adiabatically expands inside the pre-depressurized process container 20, the $CO_2$ gas is cooled to a condensation temperature. As a result, $CO_2$ molecules are bonded to one another by the Van der Waals force and forms the cluster 4 which is an aggregate of the $CO_2$ molecules.

The cluster 4 collides with the particles 5 adhering to the main surface 3 of the substrate 2 and blows off the particles 5. Even when the cluster 4 collides with the main surface 3 without directly colliding with the particles 5, the cluster 4 also blows off the particles 5 in the vicinity of a collision position. Further, since the cluster 4 becomes hot due to the collision, the cluster 4 is decomposed into pieces and sucked by the gas suction part 70.

By the way, when a size of the cluster 4 is too small, the removal efficiency of the particles 5 is too low. On the other hand, when the size of the cluster 4 is too large, the uneven pattern previously formed on the main surface 3 of the substrate 2 collapses. Further, when the size of the cluster 4 is too large, stain-like defects may occur on the main surface 3 of the substrate 2.

Therefore, the size of the cluster 4 is adjusted. The size of the cluster 4 can be adjusted by, for example, the gas supply pressure P to the nozzle 40, a flow rate ratio of the cluster forming gas and the carrier gas, the pressure inside the process container 20, and the like. The gas supply pressure P to the nozzle 40 is, for example, 0.5 MPa to 5 MPa, specifically 0.5 MPa to 0.9 MPa. The flow rate ratio of the cluster forming gas and the carrier gas is, for example, 10:90 to 90:10. A flow rate means a normal flow rate (unit: slm) measured at $^0$ degree C. and the atmospheric pressure. A temperature of the nozzle 40 is, for example, −50 degrees C. to −10 degrees C. The pressure inside the process container 20 is, for example, 5 Pa to 120 Pa.

The controller 90 is configured as, for example, a computer and includes a central processing unit (CPU) 91 and a storage medium 92 such as a memory. The storage medium 92 stores a program that controls various processes executed by the substrate cleaning device 10. The controller 90 controls operations of the substrate cleaning device 10 by causing the CPU 91 to execute the program stored in the storage medium 92. In addition, the controller 90 includes an input interface 93 and an output interface 94. The controller 90 receives signals from the outside via the input interface 93, and transmits signals to the outside via the output interface 94.

The program has been stored in a computer-readable storage medium and may be installed from the computer-readable storage medium in the storage medium 92 of the controller 90. Examples of the computer-readable storage medium may include a hard disk (HD), a flexible disk (FD), a compact disc (CD), a magnet-optical disc (MO), a memory card, and the like. The program may be downloaded from a server via the Internet and installed in the storage medium 92 of the controller 90.

Figure 4:
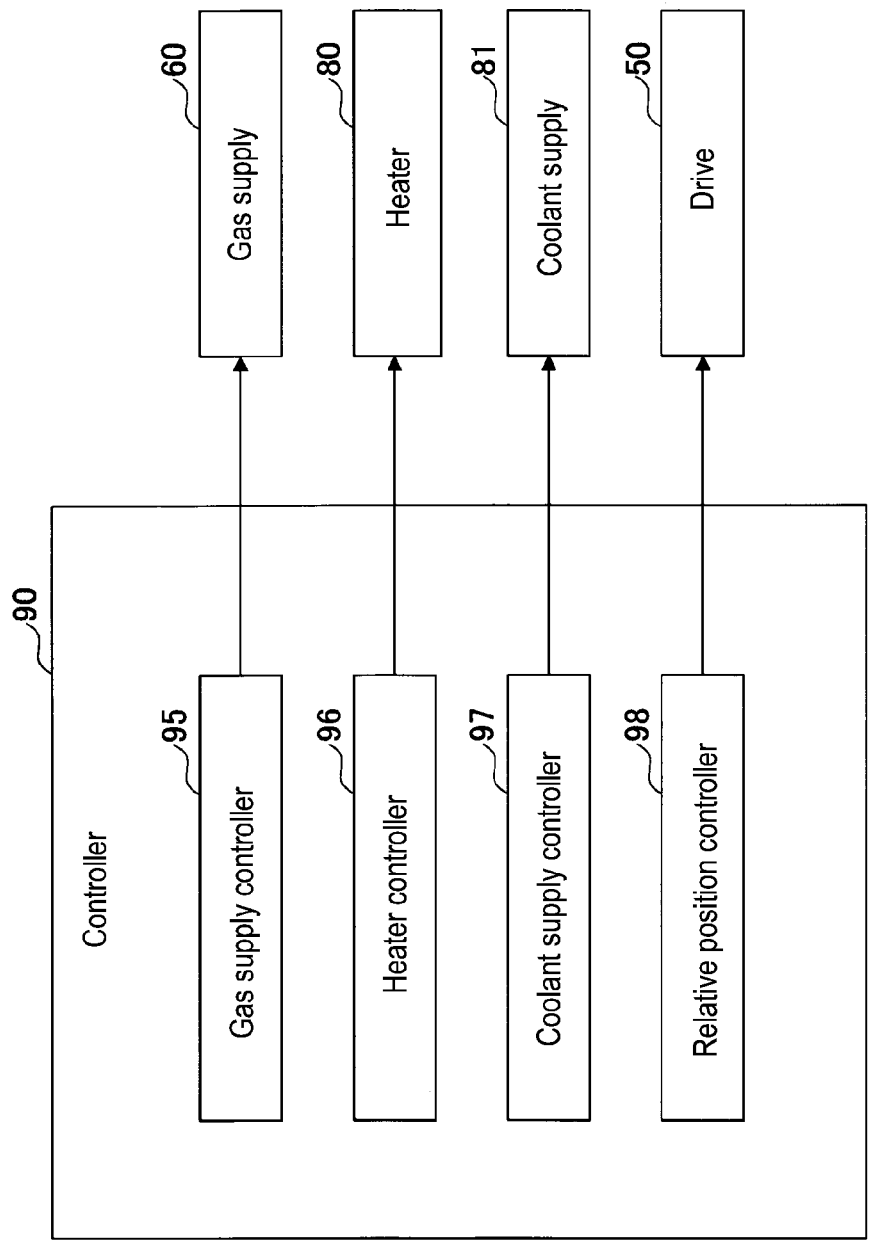
FIG. 4 is a functional block diagram showing components of a controller according to an embodiment.

FIG. 4 is a functional block diagram showing components of the controller according to an embodiment. Each functional block shown in FIG. 4 is conceptual and does not necessarily have to be physically configured as shown in FIG. 4. All or part of each functional block can be configured by being functionally or physically distributed or integrated in any unit. All or any part of each processing function performed in each function block can be implemented by a program executed by the CPU, or can be implemented as hardware by wired logic.

As shown in FIG. 4, the controller 90 includes a gas supply controller 95, a heater controller 96, a coolant supply controller 97, and a relative position controller 98. The gas supply controller 95 controls the gas supply 60. The gas supply 60 supplies the cluster forming gas and the carrier gas to the nozzle 40. The heater controller 96 controls a heater 80. The heater 80 heats the nozzle 40. The heater 80 is, for example, a heating wire disposed inside the nozzle 40. The coolant supply controller 97 controls a coolant supply 81. The coolant supply 81 regulates the temperature of the nozzle 40 by supplying a coolant to the nozzle 40. A flow path through which the coolant flows is formed around the nozzle 40. The coolant may be either a gas or a liquid. A temperature of the coolant is lower than room temperature. Therefore, when the coolant supply controller 97 tops the supply of the coolant to the nozzle 40, the temperature of the nozzle 40 naturally increases even when the nozzle 40 is not heated. The relative position controller 98 controls the drive 50. The drive 50 moves a relative position of the nozzle 40 and the substrate holder 30 between a position where a gas is injected from the nozzle 40 toward the substrate 2 and a position where a gas is injected from the nozzle 40 toward the outside of the substrate 2.

Figure 5:
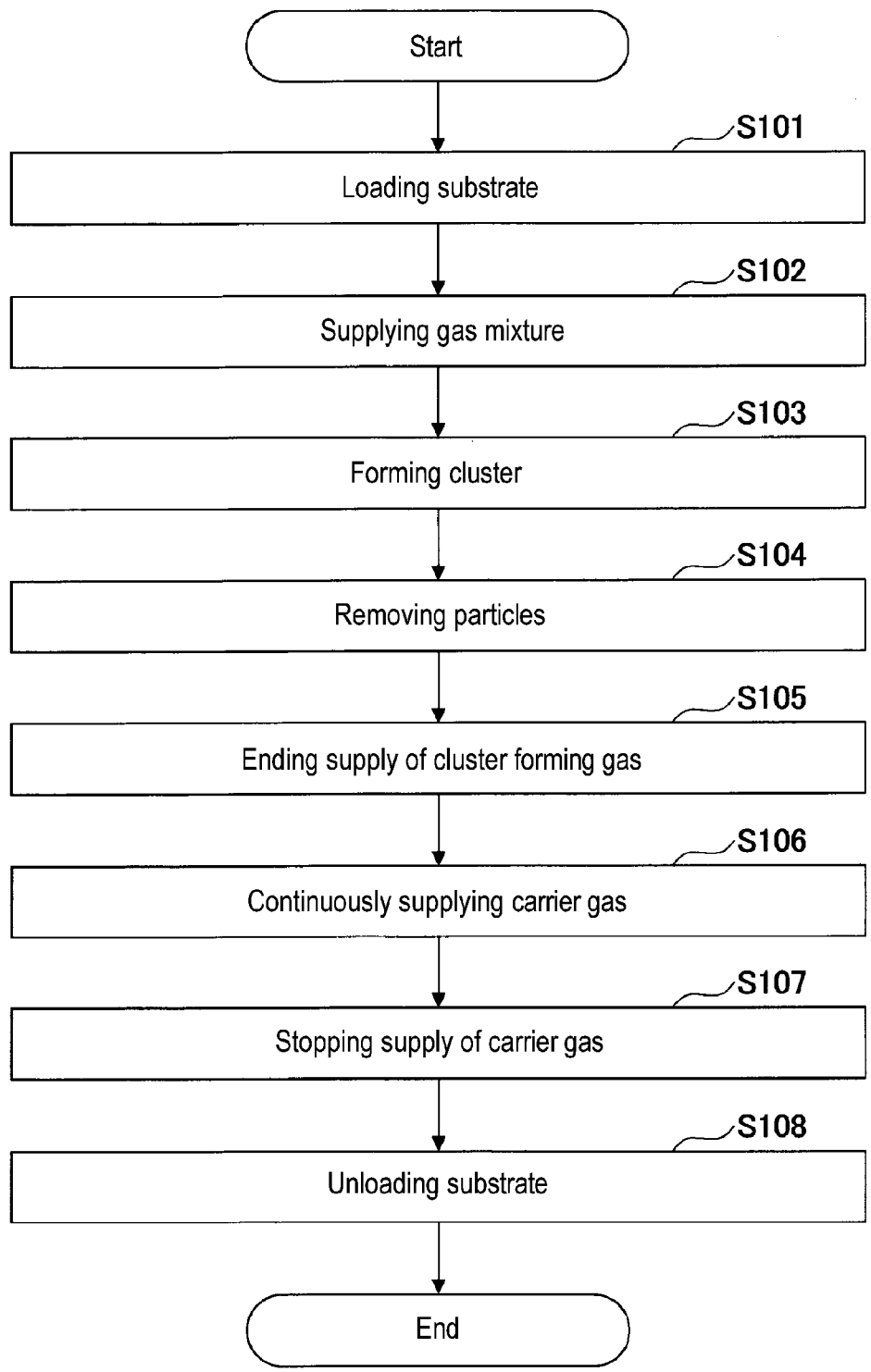
FIG. 5 is a flowchart showing a substrate cleaning method according to an embodiment.

FIG. 5 is a flowchart showing a substrate cleaning method according to an embodiment. Each step shown in FIG. 5 is carried out under the control of the controller 90.

The substrate cleaning method includes step S101 of loading the substrate 2 into the process container 20. In the step S101, a transfer device (not shown) loads the substrate 2 into the process container 20 from the outside of the process container 20, and disposes the loaded substrate 2 on the substrate holding surface 31 of the substrate holder 30. The substrate holder 30 holds the substrate 2 horizontally with the main surface 3 of the substrate 2 facing upward.

The substrate cleaning method includes step S102 of supplying a gas mixture of the cluster forming gas and the carrier gas to the nozzle 40. In the step S102, the gas supply 60 supplies the gas mixture to the nozzle 40. The cluster forming gas is, for example, $CO_2$ gas, and the carrier gas is, for example, $H_2$ gas. The carrier gas increases the gas supply pressure P to the nozzle 40 to a desired pressure while suppressing liquefaction of the cluster forming gas inside the nozzle 40.

When the gas supply pressure P is too low, adiabatic expansion of the cluster forming gas, that is, acceleration of the cluster forming gas, is not sufficient, so that the cluster 4 does not grow to a size sufficient for removing the particles 5. On the other hand, when the gas supply pressure P is increased to the desired pressure by using the cluster forming gas only, the pressure of the cluster forming gas exceeds a saturated vapor pressure, so that the cluster forming gas is liquefied inside the nozzle 40.

The carrier gas suppresses the liquefaction of the cluster forming gas inside the nozzle 40 by lowering a partial pressure of the cluster forming gas. In addition, the carrier gas can sufficiently accelerate the cluster forming gas by increasing the gas supply pressure P to the nozzle 40 to the desired pressure, so that the cluster 4 can grow to a size sufficient for removing the particles 5.

In parallel with the supply of the gas mixture to the nozzle 40 by the gas supply 60, the gas suction part 70 sucks the gas inside the process container 20 to keep the pressure inside the process container 20 constant.

The substrate cleaning method includes step 5103 of forming the cluster 4 by injecting the gas mixture from the nozzle 40. Since the $CO_2$ gas contained in the gas mixture adiabatically expands inside the process container 20 that has been depressurized in advance, the $CO_2$ gas is cooled to the condensation temperature. As a result, $CO_2$ molecules are bonded to one another by the Van der Waals force and forms the cluster 4 which is an aggregate of the $CO_2$ molecules.

The substrate cleaning method includes step S104 of removing the particles 5 adhering to the main surface 3 of the substrate 2 by the cluster 4. The cluster 4 collides with the particles 5 and blows off the particles 5. The cluster 4 can also blow off the particles 5 in the vicinity of the collision position even when colliding with the main surface 3 without directly colliding with the particles 5.

The steps S102 to S104 described above are repeatedly performed while changing the collision position where the cluster 4 collides with the main surface 3 of the substrate 2. The change is carried out, for example, by moving the nozzle 40 in the radial direction of the substrate 2 the drive 50 while the rotary drive 36 rotates the substrate holder 30.

The cluster 4 can collide with the entire main surface 3 of the substrate 2, so that the entire main surface 3 of the substrate 2 can be cleaned.

In the present embodiment, the collision position where the cluster 4 collides with the main surface 3 of the substrate 2 is changed by moving the nozzle 40 in the radial direction of the substrate 2 while rotating the substrate holder 30, but the technique of the present disclosure is not limited thereto. For example, the substrate holder 30 may be moved in the X-axis direction and the Y-axis direction while the nozzle 40 is fixed.

After the steps S102 to S104 described above, the supply of the cluster forming gas to the nozzle 40 ends (step S105) and the supply of the carrier gas to the nozzle 40 ends (step S107).

The substrate cleaning method includes the step S105 of ending the supply of the cluster forming gas to the nozzle 40. In the step S105, the gas supply controller 95 closes the first opening/closing valve 64 to end the supply of the cluster forming gas to the nozzle 40. At this time, the gas supply controller 95 keeps the second opening/closing valve 66 to be open without closing the second opening/closing valve 66.

The substrate cleaning method includes step S106 of continuously supplying the carrier gas to the nozzle 40 for a set time period At from the time when the supply of the cluster forming gas to the nozzle 40 ends. In the step S106, the gas supply controller 95 continues to open the second opening/closing valve 66 to continuously supply the carrier gas to the nozzle 40. The cluster forming gas remaining inside the nozzle 40 can be replaced with the carrier gas. The set time period At is predetermined through experiments or the like so that the cluster forming gas is not liquefied inside the nozzle 40, that is, the partial pressure of the cluster forming gas becomes sufficiently lower than the saturated vapor pressure, as will be described later.

The substrate cleaning method includes the step S107 of ending the supply of the carrier gas to the nozzle 40. In the step S107, the gas supply controller 95 closes the second opening/closing valve 66 to end the supply of the carrier gas to the nozzle 40. The gas supply controller 95 replaces the cluster forming gas remaining inside the nozzle 40 with the carrier gas, and then ends the supply of the carrier gas to the nozzle 40.

The substrate cleaning method includes step S108 of unloading the substrate 2 from the inside of the process container 20 to the outside of the process container 20. In the step S108, the substrate holder 30 releases holding the substrate 2, and the transfer device (not shown) receives the substrate 2 from the substrate holder 30 and unloads the received substrate 2 from the inside of the process container 20 to the outside of the process container 20. Thereafter, the process ends.

Conventionally, ending the supply of the cluster forming gas to the nozzle 40 (step S105) and ending the supply of the carrier gas to the nozzle 40 (step S107) have been performed at the same time. This was one of the causes of stain-like defects on the main surface 3 of the substrate 2.

When ending the supply of the cluster forming gas (step S105) and ending the supply of the carrier gas (step S107) are performed at the same time, the carrier gas escapes from the nozzle 40 earlier than the cluster forming gas. The reason is that the molecular weight or atomic weight of the carrier gas is smaller than the molecular weight or atomic weight of the cluster forming gas.

Since the carrier gas tends to escape from the nozzle 40 earlier than the cluster forming gas, a ratio of the cluster forming gas occupied in the internal space of the nozzle 40 increases. As a result, the cluster forming gas or impurities inevitably contained in the cluster forming gas may be liquefied in the internal space of the nozzle 40.

When the liquefied gas is injected from the nozzle 40, the liquefied gas adheres to the main surface 3 of the substrate 2. This adhesion is stain-like defects. Further, when the cluster forming gas or the impurities therein are liquefied inside the nozzle 40, the cluster 4 is formed hugely, which causes a problem that the uneven pattern of the main surface 3 of the substrate 2 collapses.

In the substrate cleaning method of the present embodiment, ending the supply of the carrier gas (step S107) is performed after ending the supply of the cluster forming gas (step S105). That is, the substrate cleaning method of the present embodiment includes the step S106 of continuously supplying the carrier gas to the nozzle 40 for the set time period At from the end of the supply of the cluster forming gas.

According to the present embodiment, after the cluster forming gas remaining inside the nozzle 40 is replaced with the carrier gas, the supply of the carrier gas to the nozzle 40 ends. As a result, it is possible to suppress the occurrence of stain-like defects on the main surface 3 of the substrate 2. In addition, it is possible to prevent the uneven pattern of the main surface 3 of the substrate 2 from collapsing.

Figure 6:
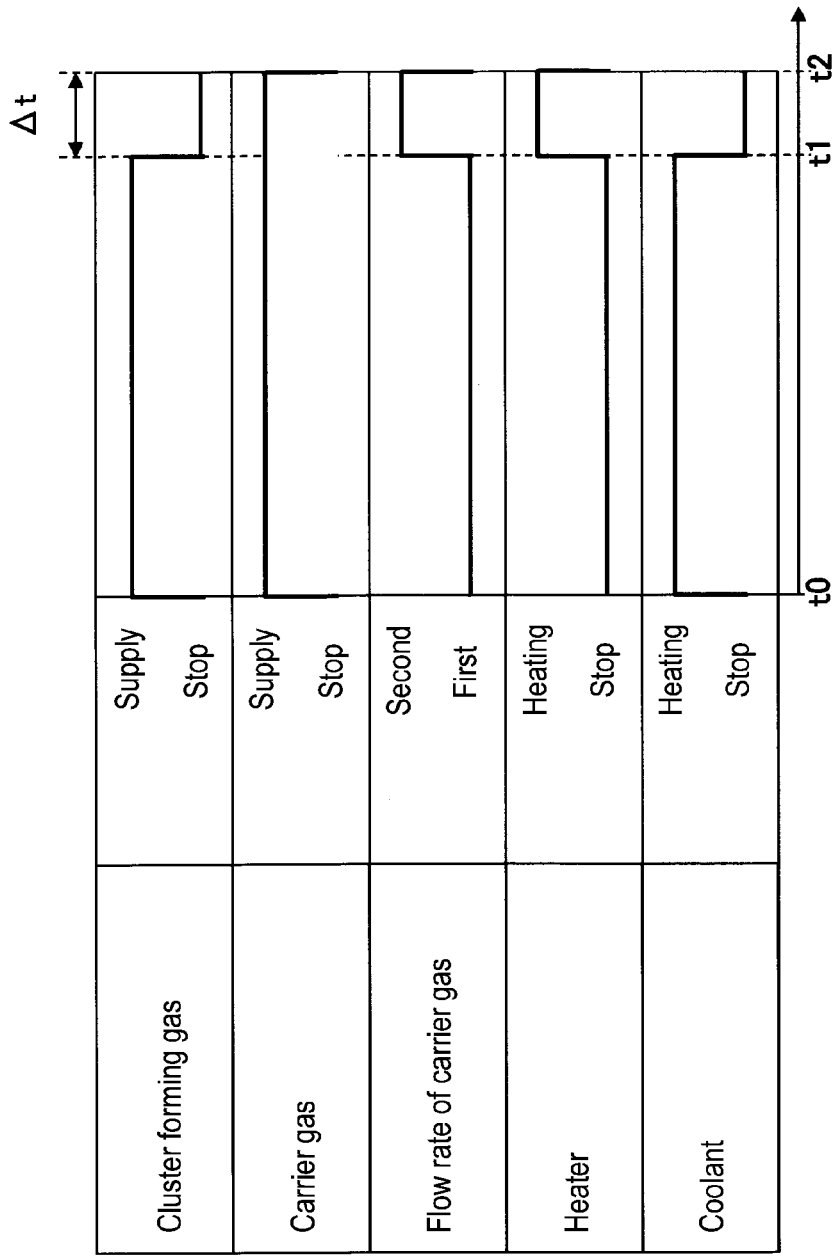
FIG. 6 is a diagram showing operation timings of the substrate cleaning device according to the embodiment.

FIG. 6 is a diagram showing operation timings of the substrate cleaning device according to the embodiment. For example, the gas supply controller 95 starts supplying both of the cluster forming gas and the carrier gas to the nozzle 40 at time t0.

The gas supply controller 95 supplies both of the cluster forming gas and the carrier gas to the nozzle 40 from time t0 to time t1. The gas supply controller 95 supplies the carrier gas to the nozzle 40 at a first flow rate FR1 from time t0 to time t1.

In addition, the heater controller 96 stops the heater 80 from heating the nozzle 40 from time t0 to time t1. As a result, the nozzle 40 can be cooled to near the condensation temperature of the cluster forming gas, so that the formation of the cluster 4 can be supported.

The coolant supply controller 97 supplies the coolant to the nozzle 40 from time t0 to time t1. As a result, the nozzle 40 can be cooled to near the condensation temperature of the cluster forming gas, so that the formation of the cluster 4 can be supported.

Thereafter, the gas supply controller 95 ends the supply of the cluster forming gas to the nozzle 40 at time t1. Subsequently, the gas supply controller 95 continues to supply the carrier gas to the nozzle 40 from time t1 to time t2. A period from time t1 to time t2 corresponds to the set time period Δt.

The gas supply controller 95 supplies the carrier gas to the nozzle 40 at a second flow rate FR2 (FR2>FR1), which is higher than the first flow rate FR1, from time t1 to time t2. The cluster forming gas remaining inside the nozzle 40 can be quickly replaced with the carrier gas.

The switching timing of the flow rate of the carrier gas from the first flow rate FR1 to the second flow rate FR2 is not necessarily time t1, and may be immediately before time t1 or after time t1. The gas supply controller 95 may supply the carrier gas to the nozzle 40 at the second flow rate FR2 during the set time period At. The cluster forming gas remaining inside the nozzle 40 can be quickly replaced with the carrier gas.

The heater controller 96 heats the nozzle 40 by the heater 80 from time t1 to time t2. Since heat is supplied to the nozzle 40, the temperature of the nozzle 40 becomes high.

As a result, it is possible to suppress the cluster forming gas or the impurities therein from being liquefied inside the nozzle 40.

The start timing of heating the nozzle 40 is not necessarily time t1, and may be immediately before time t1 or after time t1. The heater controller 96 may heat the nozzle 40 by the heater 80 during the set time period Δt. Since heat is supplied to the nozzle 40, the temperature of the nozzle 40 becomes high. As a result, it is possible to suppress the cluster forming gas or the impurities therein from being liquefied inside the nozzle 40.

The coolant supply controller 97 stops supplying the coolant to the nozzle 40 from time t1 to time t2. Since the coolant is not supplied to the nozzle 40, the temperature of the nozzle 40 becomes high. As a result, it is possible to suppress the cluster forming gas or the impurities therein from being liquefied inside the nozzle 40.

In addition, the end timing of supplying the coolant is not necessarily time t1, and may be immediately before time t1 or after time t1. The coolant supply controller 97 may stop supplying the coolant to the nozzle 40 during the set time period Δt. Since the coolant is not supplied to the nozzle 40, the temperature of the nozzle 40 naturally increases even when the nozzle 40 is not heated. As a result, it is possible to suppress the cluster forming gas or the impurities therein from being liquefied inside the nozzle 40.

The relative position controller 98 sets the relative position of the nozzle 40 and the substrate 2 to the position where a gas is injected from the nozzle 40 toward the substrate 2 from time t1 to time t2. When the relative position of the nozzle 40 and the substrate 2 is set to the position where the gas is injected from the nozzle 40 toward the outside of the substrate 2 from time t1 to time t2, the gas collides with an inner wall surface of the process container 20. As a result, deposits adhering to the inner wall surface of the process container 20 are peeled off. The peeled deposits may fly up and adhere to the main surface 3 of the substrate 2.

In the present embodiment, the relative position controller 98 sets the relative position of the nozzle 40 and the substrate 2 to the position where a gas is injected from the nozzle 40 toward the substrate 2 from time t1 to time t2. The gas injected from the nozzle 40 collides with the substrate 2 and a flow velocity of the gas is reduced. The gas having the reduced flow velocity collides with the inner wall surface of the process container 20. Therefore, it is possible to suppress the deposits adhering to the inner wall surface of the process container 20 from being peeled off, thereby suppressing the deposits from adhering to the main surface 3 of the substrate 2.

Figure 7:
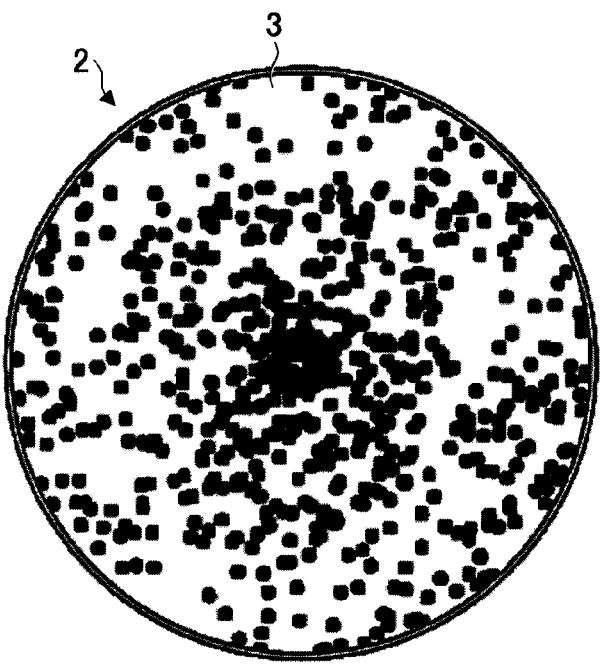
FIG. 7 is a view showing a contamination state of a substrate after cleaning according to an example.
Figure 8:
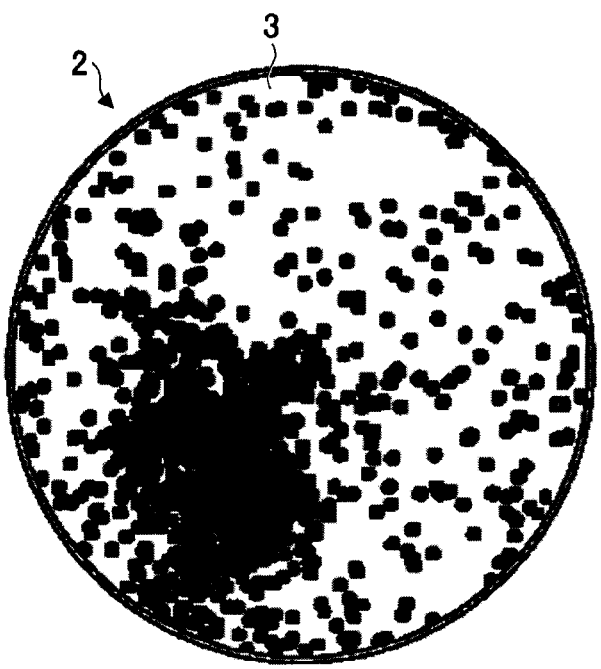
FIG. 8 is a view showing a contamination state of a substrate after cleaning according to a conventional example.

FIG. 7 is a view showing a contamination state of a substrate after cleaning according to an example. FIG. 8 is a view showing a contamination state of a substrate after cleaning according to a conventional example. In FIGS. 7 and 8, black dots represent locations of defects.

In the example shown in FIG. 7, from time t0 to time t1, the supply pressure P of the gas mixture to the nozzle 40 was 0.9 MPa, the flow rate ratio between the cluster forming gas and the carrier gas was 25:75, the temperature of the nozzle 40 was −40 degrees C., the pressure inside the process container 20 was, for example, 100 Pa, and a distance between the nozzle 40 and the substrate 2 was 60 mm. The cluster forming gas was $CO_2$ gas, and the carrier gas was $H_2$ gas. The set time period Δt was 30 seconds.

In addition, in the example shown in FIG. 7, from time t1 to time t2, increasing the flow rate of the carrier gas, heating the heater 80, and stopping the supply of the coolant shown in FIG. 6 were not carried out. That is, in the example shown in FIG. 7, from time t0 to time t2, the flow rate of the carrier gas was constant, the heater 80 did not heat the nozzle 40, and the coolant supply 81 continued to supply the coolant to the nozzle 40.

In the conventional example shown in FIG. 8, the substrate was cleaned in the same manner as in the example shown in FIG. 7, except that the supply of the cluster forming gas and the supply of the carrier gas ended at the same time.

As is apparent from the comparison between FIGS. 7 and 8, it can be recognized that by continuously supplying the carrier gas to the nozzle 40 for the set time period Δt from the end of the supply of the cluster forming gas, it is possible to suppress stain-like defects from occurring on the main surface 3 of the substrate 2.

Although the embodiments of the substrate cleaning method and the substrate cleaning device according to the present disclosure have been described above, the present disclosure is not limited to the above embodiments and the like. Various changes, modifications, replacements, additions, deletions, and combinations are possible within the scope of the claims. Of course, they also belong to the technical scope of the present disclosure.

The substrate 2 of the above embodiments is a silicon wafer, but the substrate 2 may be a silicon carbide substrate, a sapphire substrate, a glass substrate, or the like.

This application claims priority based on Japanese Patent Application No. 2019-193049, filed with the Japan Patent Office on Oct. 23, 2019, the entire contents of which are incorporated herein by reference.

EXPLANATION OF REFERENCE NUMERALS

2: substrate, 3: main surface, 4: cluster, 5: particles, 10: substrate cleaning device, 20: process container, 30: substrate holder, 40: nozzle, 50: drive, 60: gas supply, 80: heater, 81: coolant supply, 90: controller, 95: gas supply controller, 96: heater controller, 97: coolant supply controller, 98: relative position controller

The invention claimed is:

1. A substrate cleaning method comprising:
supplying a gas mixture of a cluster forming gas for forming a cluster by adiabatic expansion and a carrier gas having a smaller molecular weight or atomic weight than the cluster forming gas to a nozzle;
forming the cluster by injecting the gas mixture from the nozzle;
removing particles adhering to a substrate by the cluster;
stopping a supply of the cluster forming gas to the nozzle while the carrier gas is supplied to the nozzle; and
suppressing a liquefication of the cluster forming gas inside the nozzle for a set time period by continuously supplying the carrier gas to the nozzle and heating the nozzle by a heater starting from an end time at which the supply of the cluster forming gas to the nozzle ends.

2. The substrate cleaning method of claim 1, wherein the supplying the gas mixture to the nozzle includes supplying the carrier gas to the nozzle at a first flow rate, and
wherein the substrate cleaning method further comprises supplying the carrier gas to the nozzle at a second flow rate higher than the first flow rate during the set time period.

3. The substrate cleaning method of claim 1, wherein the supplying the gas mixture to the nozzle includes stopping heating the nozzle by the heater.

4. The substrate cleaning method of claim 2, wherein the supplying the gas mixture to the nozzle includes stopping heating the nozzle by the heater.

5. The substrate cleaning method of claim 1, wherein the supplying the gas mixture to the nozzle includes supplying a coolant to the nozzle, and
wherein the substrate cleaning method further comprises stopping a supply of the coolant to the nozzle during the set time period.

6. The substrate cleaning method of claim 2, wherein the supplying the gas mixture to the nozzle includes supplying a coolant to the nozzle, and
wherein the substrate cleaning method further comprises stopping a supply of the coolant to the nozzle during the set time period.

7. The substrate cleaning method of claim 1, further comprising setting a relative position of the nozzle and the substrate to a position where a gas is injected from the nozzle toward the substrate during the set time period.

8. The substrate cleaning method of claim 2, further comprising setting a relative position of the nozzle and the substrate to a position where a gas is injected from the nozzle toward the substrate during the set time period.

9. The substrate cleaning method of claim 1, wherein the cluster forming gas includes one or more gases selected from the group consisting of carbon dioxide gas and argon gas, and
wherein the carrier gas includes one or more gases selected from the group consisting of hydrogen gas and helium gas.

10. The substrate cleaning method of claim 2, wherein the cluster forming gas includes one or more gases selected from the group consisting of carbon dioxide gas and argon gas, and
wherein the carrier gas includes one or more gases selected from the group consisting of hydrogen gas and helium gas.

* * * * *